US009327961B2

(12) United States Patent
Lemarquand et al.

(10) Patent No.: US 9,327,961 B2
(45) Date of Patent: May 3, 2016

(54) ELECTRODYNAMIC SPEAKER STRUCTURE HAVING MEMS TECHNOLOGY

(75) Inventors: Guy Lemarquand, Le Mans (FR); Valerie Lemarquand, Le Mans (FR); Elie Marie Lefeuvre, Montreuil (FR); Marion Alexandra Laurence Woytasik, Cachan (FR); Johan Moulin, Antony (FR); Fabien Jean François Parrain, Echarcon (FR)

(73) Assignees: UNIVERSITE DU MAINE, Le Mans (FR); UNIVERSITE PARIS-SUD 11, Orsay (FR)

( * ) Notice: Subject to any disclaimer, the term of this patent is extended or adjusted under 35 U.S.C. 154(b) by 0 days.

(21) Appl. No.: 13/522,930

(22) PCT Filed: Jan. 14, 2011

(86) PCT No.: PCT/FR2011/050070
§ 371 (c)(1),
(2), (4) Date: Mar. 5, 2013

(87) PCT Pub. No.: WO2011/089345
PCT Pub. Date: Jul. 28, 2011

(65) Prior Publication Data
US 2013/0156253 A1    Jun. 20, 2013

(30) Foreign Application Priority Data

Jan. 19, 2010    (FR) .................................... 10 50330

(51) Int. Cl.
*H04R 1/00*    (2006.01)
*H04R 9/06*    (2006.01)
(Continued)

(52) U.S. Cl.
CPC ........ *B81B 3/007* (2013.01); *H04R 7/18* (2013.01); *H04R 23/00* (2013.01);
(Continued)

(58) Field of Classification Search
CPC ...... H04R 9/06; H04R 9/025; H04R 2499/11; H04R 2307/025; H04R 1/00; H04R 7/18; H04R 7/20; H04R 31/00; H04R 31/006; H04R 19/005; H04R 2231/003; H04R 2307/207; H04R 2201/003; B81B 2201/0257
USPC .......... 381/150, 396, 398, 408, 410; 257/416, 257/419
See application file for complete search history.

(56) References Cited

U.S. PATENT DOCUMENTS 1,708,938 A *    4/1929    Crandall et al. ............... 367/149
2008/0123242 A1*    5/2008    Zhou ............................ 361/290

FOREIGN PATENT DOCUMENTS

| JP | WO 2007020925 A1 * | 2/2007 |
| WO | WO 2007/020925 A1 | 2/2007 |
| WO | WO 2008/011466 A1 | 1/2008 |

OTHER PUBLICATIONS

Sang-Soo JE, Fernando Rivas, Rodolfo E. Diaz, Jiuk Kwon, Jeonghwan Kim, Bertan Bakkaloglu, "A Compact and Low-Cost MEMS Loudspeaker for Digital Hearing Aids."—IEEE Transactions on Biomedical Circuits and Systems, vol. 3, No. 5, pp. 348-358—Oct. 1, 2009.

(Continued)

*Primary Examiner* — Matthew Eason
(74) *Attorney, Agent, or Firm* — Blank Rome LLP

(57) ABSTRACT

The present invention relates to the field of electrodynamic speakers. Particularly, the present invention relates to an electrodynamic speaker structure having MEMS technology. More particularly, the invention relates to such a structure comprising stator-forming means, diaphragm-forming means, and resiliently shape-changing means for connecting such means.

16 Claims, 7 Drawing Sheets

(51) Int. Cl.
*H04R 11/02* (2006.01)
*B81B 3/00* (2006.01)
*H04R 7/18* (2006.01)
*H04R 23/00* (2006.01)
*H04R 7/04* (2006.01)
*H04R 9/04* (2006.01)
*H04R 9/10* (2006.01)
*H04R 31/00* (2006.01)

(52) U.S. Cl.
CPC .......... *B81B 2201/0257* (2013.01); *H04R 7/04* (2013.01); *H04R 9/047* (2013.01); *H04R 9/06* (2013.01); *H04R 9/10* (2013.01); *H04R 31/006* (2013.01); *H04R 2201/003* (2013.01)

(56) References Cited

OTHER PUBLICATIONS

Yu Wen-Huang, Tzu-Yuan Chao and Y.T. Cheng, "Synthesis and Device Fabrication of Cu—Ni Nanocomposite for Low Power Magnetic Microactuation"—7th IEEE Conference on Nanotechnology, pp. 899-902—Aug. 2, 2007.

An International Search Report, mailed Apr. 4, 2011, which issued during the prosecution of PCT/FR2011/050070.

I. Shahosseini et al., Microstructured silicon membrane with soft suspension beams for a high performance MEMS microspeaker, Microsyst Technol., Mar. 2012, DOI 10.1007/s00542-012-1477-1.

* cited by examiner

ELECTRODYNAMIC SPEAKER STRUCTURE HAVING MEMS TECHNOLOGY

CROSS REFERENCE TO RELATED APPLICATIONS

This application is a U.S. National Phase application under 35 U.S.C. §371 of International Application No. PCT/FR2011/050007, filed on Jan. 14, 2011 which claims priority to FR 10 50330, filed Jan. 19, 2010. All of these applications are herein incorporated by reference.

The present invention relates to an electrodynamic speaker structure having MEMS technology.

More particularly, the invention relates to such a structure comprising stator-forming means, diaphragm-forming means, and resiliently shape-changing means for connecting all of said means.

Already known from the state of the art are speaker structures of this type like that described for example in document IEEE "Transactions on Biomedical Circuits and Systems," volume 3, No. 5, October 2009, for "A Compact and Low-Cost MEMS Loudspeaker for Digital Hearing Aids," by Sang-Soo Je et al.

In this document, the diaphragm-forming means assume the form of a polyimide membrane associated with stator-forming means made based on a silicon chip.

This diaphragm-forming means structure nevertheless has a certain number of drawbacks, in particular related to the complexity of producing it, its power limitations, and its output.

The invention therefore aims to resolve these problems.

To that end, the invention relates to an electrodynamic speaker structure having MEMS technology, comprising a stator-forming means, diaphragm-forming means, and resiliently shape-changing means for connecting all of said means, characterized in that the stator-forming means, diaphragm-forming means, and connecting means are made of a single part by machining a silicon chip.

According to other aspects of the invention, the speaker structure includes one or more of the following features:
- the connecting means include connecting arms regularly distributed between the stator-forming means and the diaphragm-forming means,
- at least one of the surfaces of the diaphragm-forming means comprises stiffening means thereof,
- the stiffening means includes ribs,
- the stiffening means includes radial ribs,
- the diaphragm-forming means has a thickness increasing toward the periphery thereof,
- at least one of the surfaces of the diaphragm-forming means includes a coil-forming means,
- the coil-forming means comprises electrical connecting portions supported by the connecting means,
- the coil-forming means is made from copper,
- at least one of the surfaces of the stator-forming means includes a means made from a hard magnetic material,
- the means made from the hard magnetic material assumes the form of a ring arranged around the diaphragm-forming means,
- the means made from a hard magnetic material is made from a Samarium-Cobalt or Iron-Neodyme-Boron alloy,
- at least one of the surfaces of the diaphragm-forming means includes blind piercings,
- the mass of the coil-forming means is equal or approximately equal to the mass of the diaphragm-forming means,
- the silicon chip in which the different means of the structure are machined is based on SOI technology, and
- the chip is made from monocrystalline silicon.

The invention will be better understood using the following description, provided solely as an example and done in reference to the appended drawings, in which.

Figure 1:
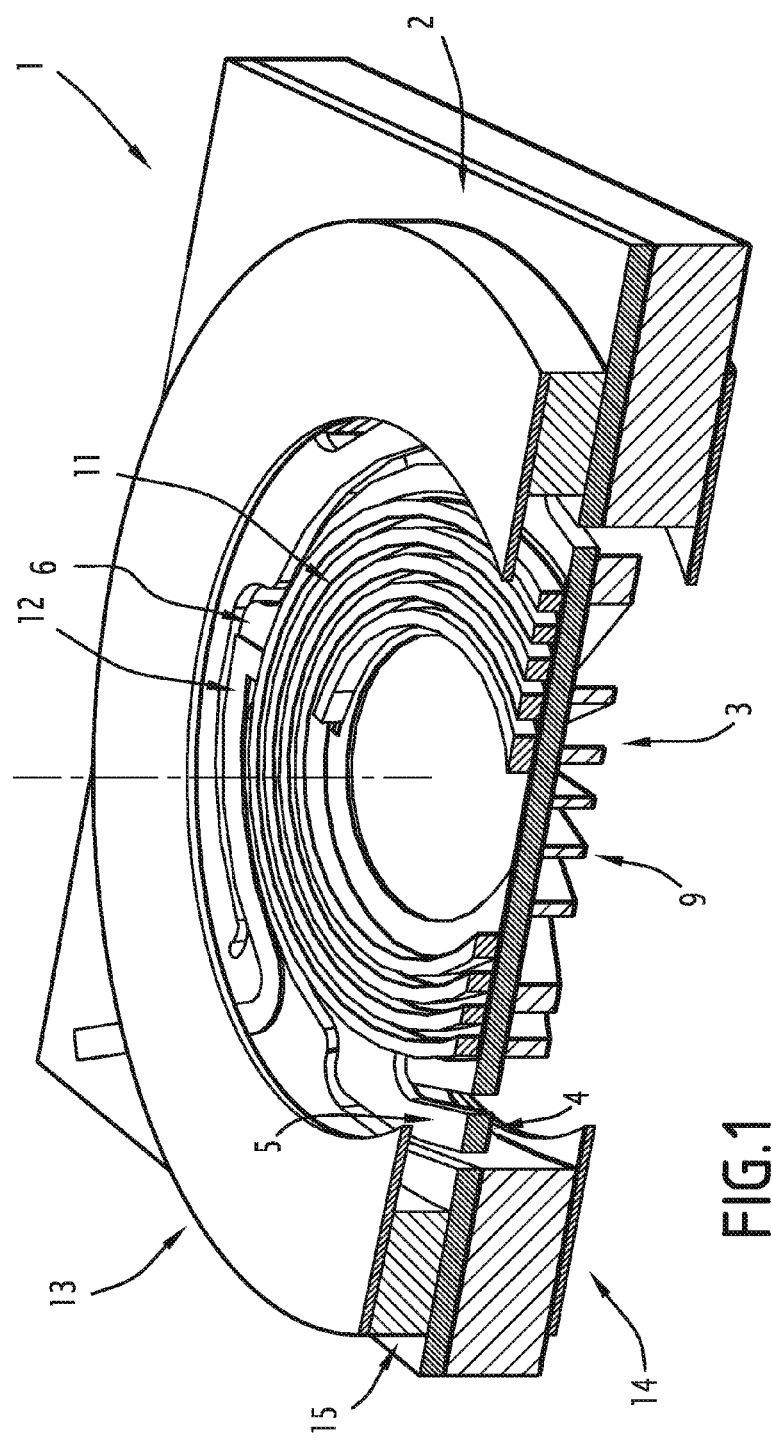
FIG. 1 shows a perspective view with a partial cutaway of a speaker structure according to the invention.
Figure 2:
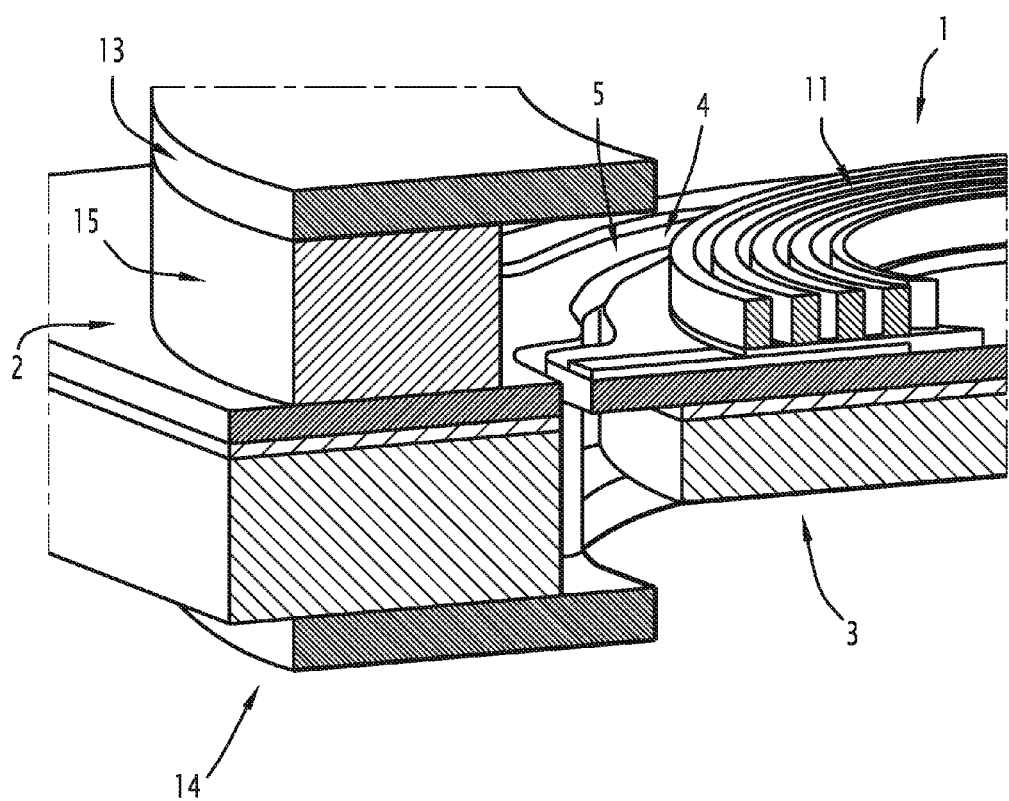
FIG. 2 shows an enlarged perspective view of one portion of said structure.

These figures, and in particular FIGS. 1 and 2, show an electrodynamic speaker structure with MEMS technology designated by general reference.

In general, such a structure includes a stator-forming means designated by general reference, diaphragm-forming means designated by general reference, and resiliently shape-changing means, for connecting all of said means, said resiliently shape-changing means being designated by general reference.

In fact and as illustrated, the stator-forming means, the membrane-forming means, and the connecting means are formed in a single piece by micro-structuring/machining a silicon chip, which is for example monocrystalline, said silicon chip for example being based on SOI (Silicon On Insulator) technology, as illustrated.

Polycrystalline silicon may also be considered.

Figure 3:
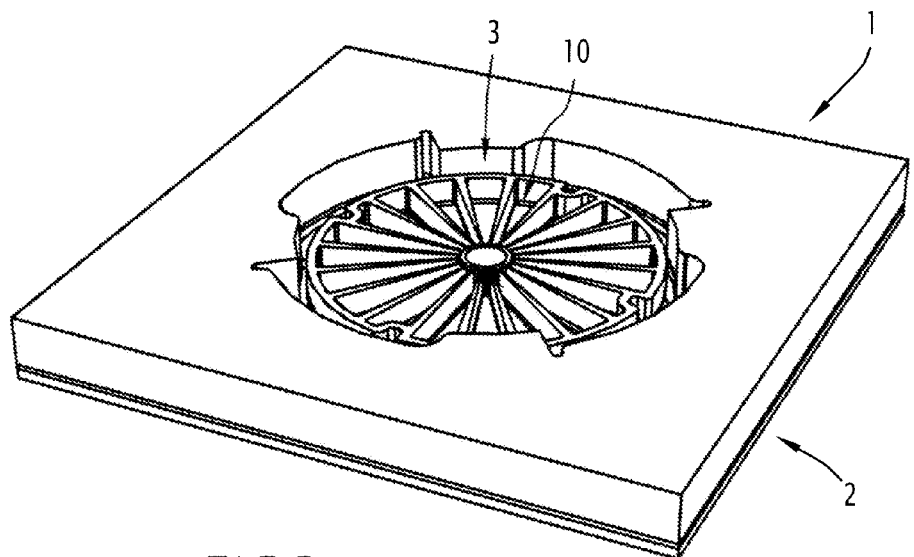
FIGS. 3 and 4 show perspective views of the rear surface of such a structure.
Figure 4:
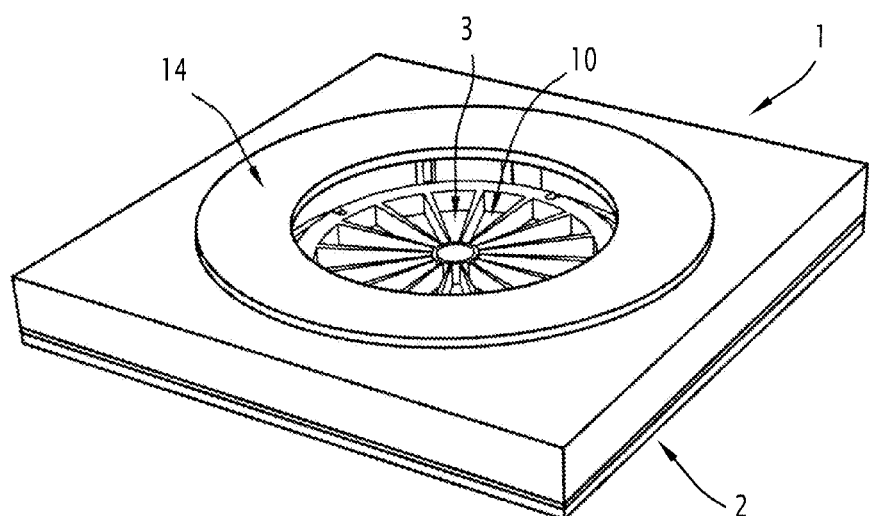
Figure 5:
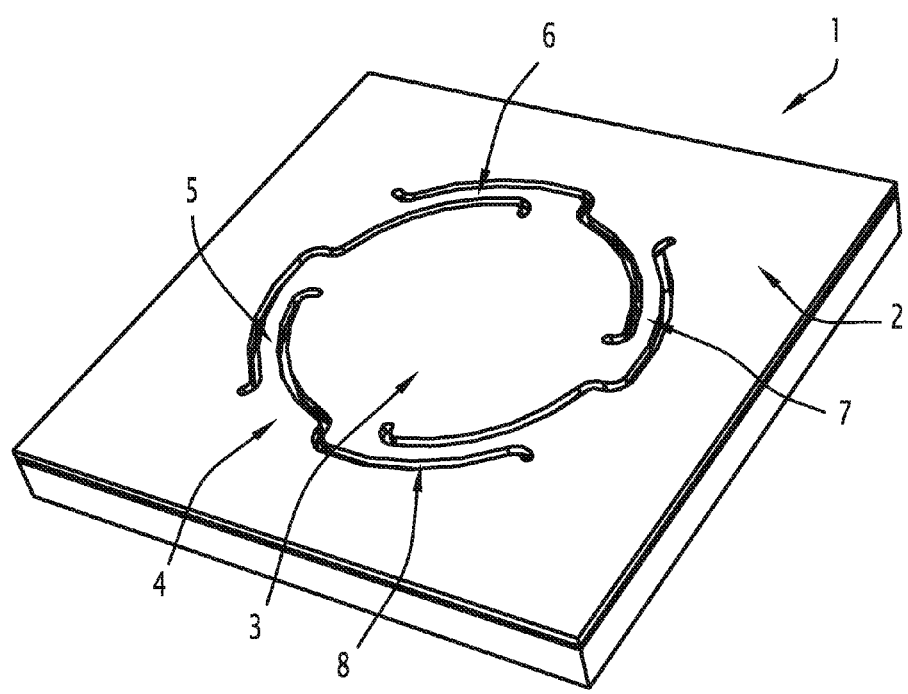
FIG. 5 illustrates the machining of a monocrystalline silicon chip to obtain a structure according to the invention.

As shown in the various FIGS. 1 to 5, and more clearly in FIG. 5, the connecting means designated by general reference in fact includes connecting arms regularly distributed between the stator-forming means and the diaphragm-forming means.

There may for example be four of these arms, as illustrated in FIG. 5.

It of course goes without saying that a different number and different forms of the arms may be considered, as will be described in more detail below.

In this FIG. 5, the different arms are designated by references 5, 6, 7 and 8, respectively.

As also illustrated in these figures, at least one of the surfaces, for example such as the rear surface of the diaphragm-forming means, comprises a stiffening means thereof.

This stiffening means is designated by general reference in these figures, and is for example made up, as more clearly shown in FIGS. 3 and 4, of stiffening ribs, preferably radial, one of which is for example designated by general reference.

In fact, this stiffening of the diaphragm-forming means may be obtained by other means such as, for example, by providing an increasing thickness of said diaphragm-forming means, from the center toward the periphery thereof.

The other surface, for example, of this diaphragm-forming means comprises a coil-forming means designated by general reference in FIGS. 1 and 2.

This coil-forming means comprises electrical connecting portions supported by the connecting means such as, for example, the portion designated by general reference in FIG. 1, said portion for example being supported by the connecting arm.

This coil-forming means can for example be made from copper, but other embodiments may of course also be considered.

Lastly, at least one of the surfaces of the stator-forming means includes a means made from a hard magnetic material that for example assumes the form of a ring arranged around the diaphragm-forming means.

This means made from a hard magnetic material may be made from a Samarium-Cobalt or Iron-Neodyme-Boron or other alloy.

In the embodiment illustrated in FIGS. 1 and 2, the two surfaces of the stator-forming means include such rings, said rings being designated by general references.

These rings are then positioned on either side of the SOI chip, a crosspiece for example being able to be associated with the ring so that said rings are positioned symmetrically on either side of the chip.

Figure 6:
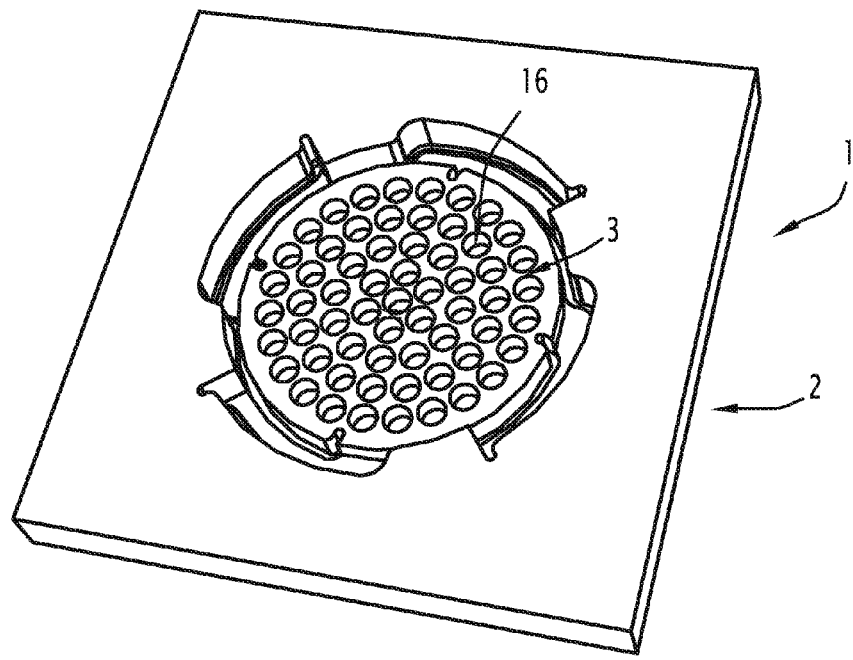
FIGS. 6 and 7 show rear views of different alternative embodiments of a structure according to the invention.
Figure 7:
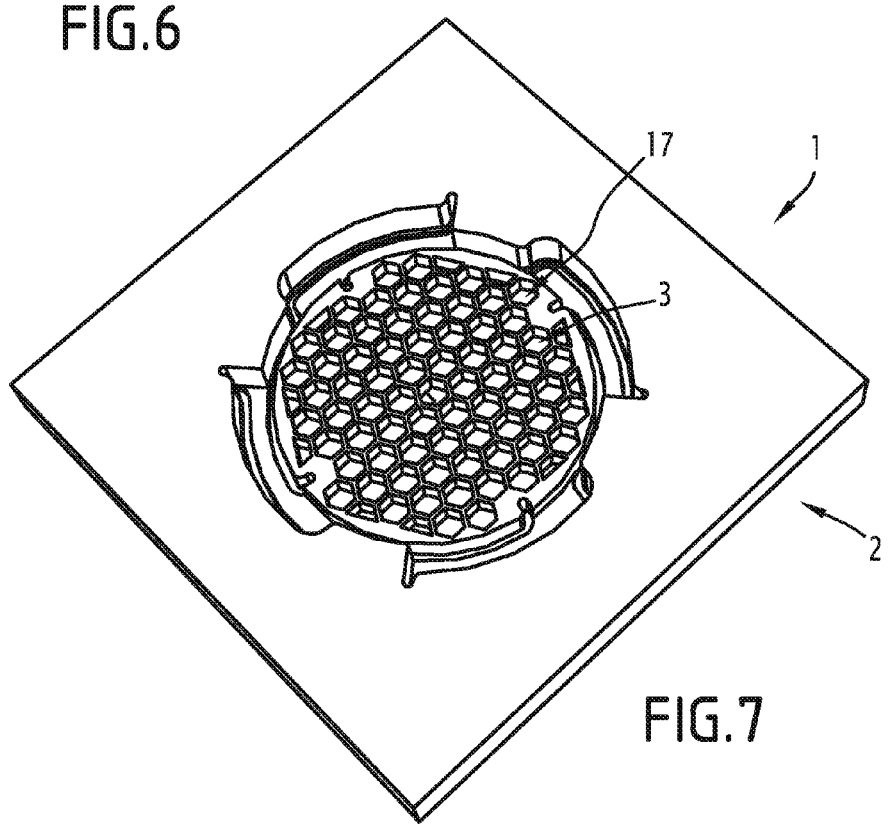
Figure 8:
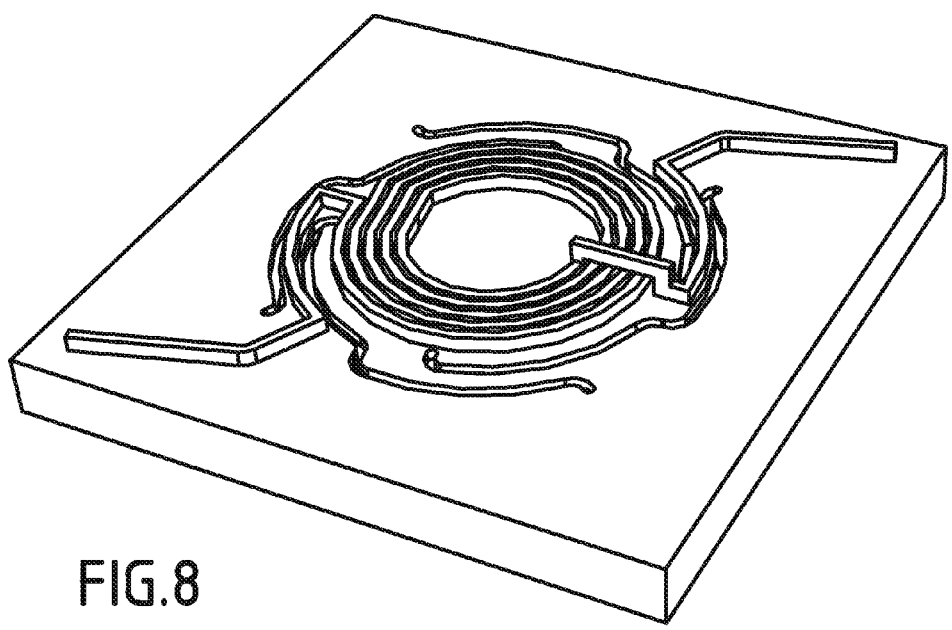
FIGS. 8 to 11 show perspective views illustrating different alternative embodiments of a speaker structure according to the invention.
Figure 9:
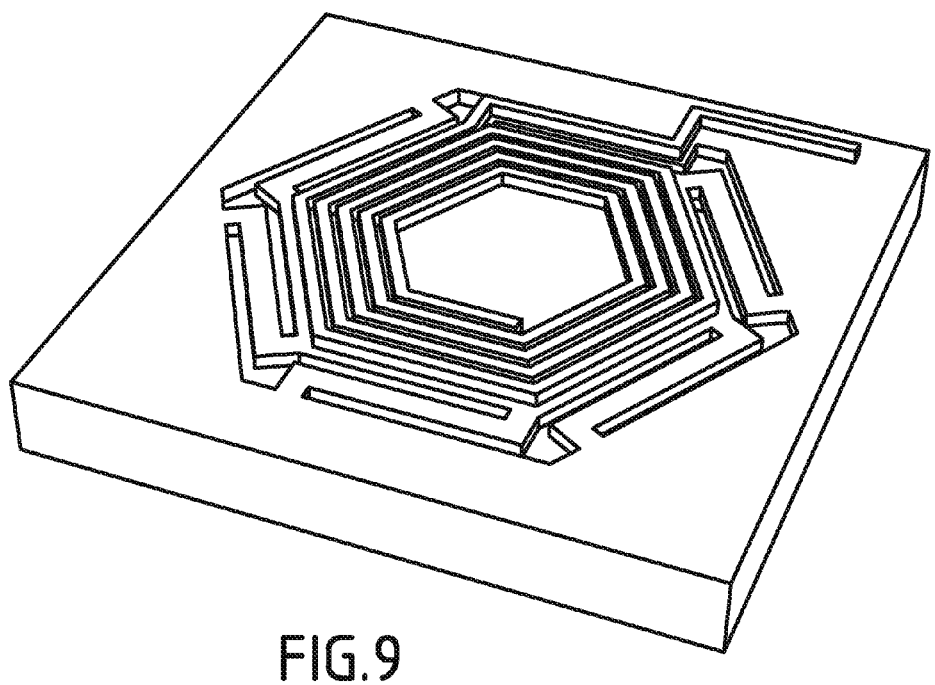
Figure 10:
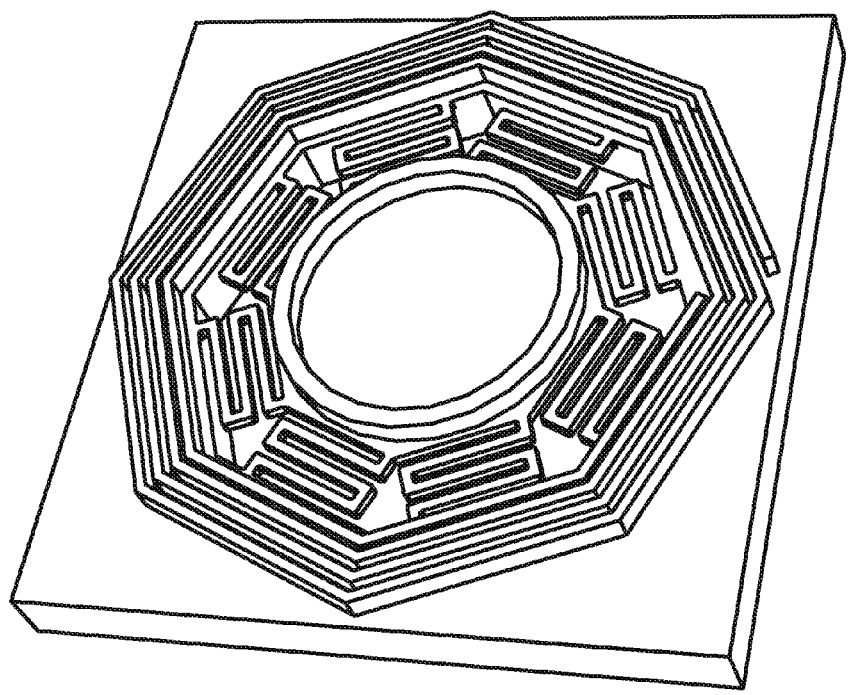
Figure 11:
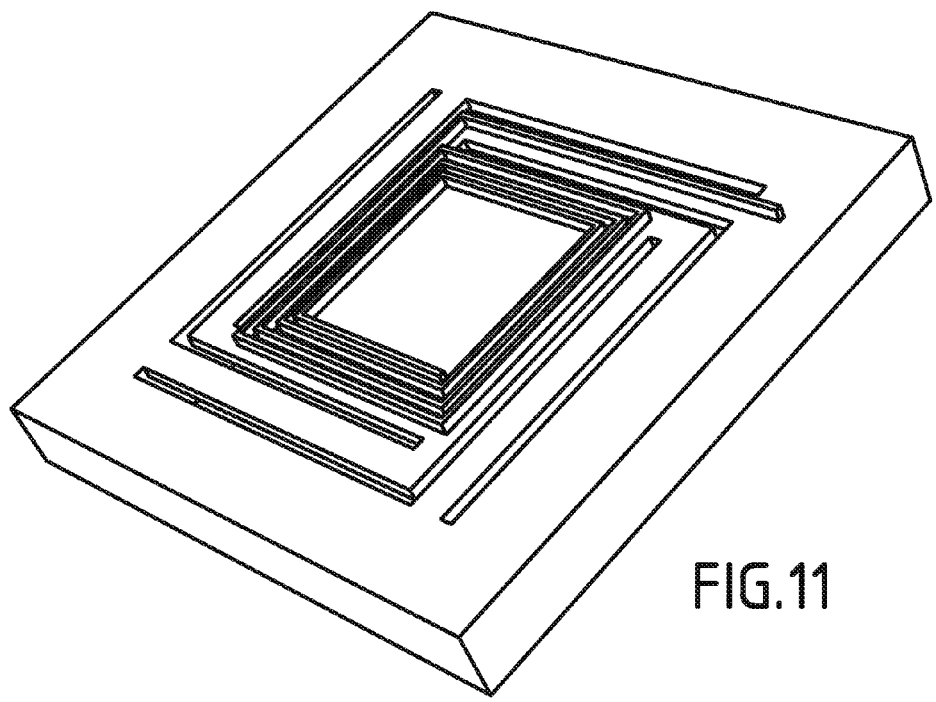

It will also be noted that, as illustrated in FIGS. 6 and 7, at least one of the surfaces of the diaphragm-forming means may comprise blind piercings such as, for example, the piercing designated by general reference in FIG. 6 or piercing in FIG. 7, these piercings being able to assume various forms.

In fact, these piercings are designed to allow the diaphragm-forming means to be lightened.

Lastly, it will be noted that the mass of the coil-forming means is equal or approximately equal to the mass of the diaphragm-forming means to optimize the output of the structure.

One can then see that the speaker structure is made collectively on a silicon substrate. Several hundreds of these structures may be made simultaneously by a "WAFER" chip, i.e. a circular silicon disk traditionally used to produce semiconductor electronic components.

The diaphragm-forming means is formed by a circular flat surface suspended by connecting arms to the stator-forming means.

The different forms are "micro-structured/machined" on the substrate.

Silicon on the one hand gives the speaker surface, i.e. the movable surface emitting the sound wave, great rigidity, and on the other hand allows the connecting arms to change shape, without undergoing mechanical fatigue.

The coil-forming means is deposited "spiraled" on the movable surface, the electrical connections being done by the connecting arms.

A ring of a hard magnetic material fastened or deposited on the stator-forming means creates a radial magnetic field.

The assembly produces an ironless magnetic circuit and allows good acoustic quality.

All or part of the electrical and signal amplification processing to power this speaker structure may be done on the same silicon chip, which in particular allows a control of the current of the movable coiling.

The production of the movable portion, diaphragm, and connecting arm is done using techniques for machining silicon already implemented to produce accelerometer microsensors, for example.

The diaphragm is a silicon disk with a diameter comprised between 5 and 15 mm and a thickness of between 20 and 400 microns, for example.

In the case of a thick diaphragm, the latter is made lighter by non-through piercings. This lightening may represent up to 90% of the initial mass. The movable mass is a key criterion for the output. The movable portion must be as light as possible, but the transmitting surface, i.e. the diaphragm, must be as rigid as possible.

Preferably, the first specific deformation mode of the speaker surface must have a frequency higher than the sharpest frequency of the bandwidth of the structure.

The connecting arms are machined to allow the desired movement and travel of the diaphragm.

The machining width of the space between the members is small enough to limit sound leakage between the front surface and rear surface of the structure.

The coil-forming means is for example made from copper and deposited on one of the surfaces of the diaphragm using a known method. The electrical continuity toward the movable portion is obtained owing to grooves arranged on the connecting arms. The central end of said coil-forming means joins an arm by the opposite surface of the diaphragm, using a known technique of electronic components.

These connecting arms can have a smaller thickness than that of the diaphragm, so as to make them more flexible.

The movement of the movable portion must therefore be a faithful image of the electrical signal that powers said coil, and that signal is amplified so as to give it the necessary power to set the diaphragm in motion.

To obtain a given acoustic power, it is necessary for a given volume of air to be set in motion, and therefore for the diaphragm to move significantly enough.

The electrical and mechanical dimensioning are thus done with that in mind, so as to obtain an acoustic source of superior quality to that obtained with the systems of the state of the art and allowing a faithful reproduction in particular of music, including at low frequencies, which is not the case today.

Such a structure is applicable in a number of fields due to the considered voltages and required autonomy, in particular in telephones, personal stereos, various music readers, etc.

Different embodiments of the invention can of course be considered, as illustrated in FIGS. 8 to 11, different forms of stator-forming means, diaphragm-forming means, coil and arms can be considered.

The invention claimed is:

1. An electrodynamic speaker structure having MEMS technology, comprising a stator-forming means, diaphragm-forming means, and resiliently shape-changing means for connecting all of said means, wherein the stator-forming means, diaphragm-forming means, and connecting means are made of a single part by machining a silicon chip; and wherein at least one of the surfaces of the diaphragm-forming means includes a coil-forming means, the mass of the coil-forming means being approximately equal to the mass of the diaphragm-forming means.

2. The electrodynamic speaker structure according to claim 1, wherein the connecting means include connecting arms regularly distributed between the stator-forming means and the diaphragm-forming means.

3. The electrodynamic speaker structure according to claim 1, wherein at least one of the surfaces of the diaphragm-forming means comprises stiffening means thereof.

4. The electrodynamic speaker structure according to claim 3, wherein the stiffening means includes ribs.

5. The electrodynamic speaker structure according to claim 4, wherein the stiffening means includes radial ribs.

6. The electrodynamic speaker structure according to claim 1, wherein the diaphragm-forming means has a thickness increasing toward the periphery thereof.

7. The electrodynamic speaker structure according to claim 1, wherein the coil-forming means comprises electrical connecting portions supported by the connecting means.

8. The electrodynamic speaker structure according to claim 1, wherein the coil-forming means is made from copper.

9. The electrodynamic speaker structure according to claim 1, wherein at least one of the surfaces of the stator-forming means includes a means made from a hard magnetic material.

10. The electrodynamic speaker structure according to claim 9, wherein the means made from the hard magnetic material assumes the form of a ring arranged around the diaphragm-forming means.

11. The electrodynamic speaker structure according to claim 9, wherein the means made from a hard magnetic material is made from a Samarium-Cobalt or Iron-Neodyme-Boron alloy.

12. The electrodynamic speaker structure according to claim 1, wherein at least one of the surfaces of the diaphragm-forming means includes blind piercings.

13. The electrodynamic speaker structure according to claim 1, wherein the silicon chip in which the different means of the structure are machined is based on SOI technology.

14. The electrodynamic speaker structure according to claim 1, wherein the chip is made from monocrystalline silicon.

15. The electrodynamic speaker structure according to claim 2, wherein the connecting arms have a smaller thickness than that of the diaphragm-forming means.

16. An electrodynamic speaker structure having MEMS technology, comprising elements including a stator, a diaphragm, and resiliently shape-changing connecting arms for connecting all of said elements, wherein the stator, the diaphragm and the connecting arms are made of a single part by machining a silicon chip, and wherein at least one of the surfaces of the diaphragm includes a coil, the mass of the coil being approximately equal to the mass of the diaphragm.

* * * * *